United States Patent [19]

Sengoku et al.

[11] Patent Number: 4,616,292
[45] Date of Patent: Oct. 7, 1986

[54] MULTILAYER PRINTED CIRCUIT BOARD

[75] Inventors: Norio Sengoku; Hiroshi Kozai, both of Hadano; Fumiyuki Kobayashi, Sagamihara, all of Japan

[73] Assignee: Hitachi, Ltd., Tokyo, Japan

[21] Appl. No.: 757,494

[22] Filed: Jul. 22, 1985

[30] Foreign Application Priority Data

Jul. 24, 1984 [JP] Japan ................. 59-153468

[51] Int. Cl.$^4$ .................................. H05K 1/14
[52] U.S. Cl. ................. 361/414; 174/68.5; 361/397; 361/409
[58] Field of Search ........... 174/68.5; 361/397–398, 361/402–403, 409, 412, 414

[56] References Cited

U.S. PATENT DOCUMENTS 2,990,310 6/1961 Chan ..................... 174/68.5
4,562,513 12/1985 Arnold et al. ............. 361/414 X

FOREIGN PATENT DOCUMENTS 49-121168 11/1974 Japan .

Primary Examiner—Arthur T. Grimley
Assistant Examiner—Jane K. Lau
Attorney, Agent, or Firm—Antonelli, Terry & Wands

[57] ABSTRACT

In a multilayer printed circuit board including a signal layer, a power supply layer, and through-holes, the shape of each of clearances formed on a power supply layer for the purpose of attaining insulation from through-holes is nearly a quadrangle having four circular corners. Thereby, the area of the power supply layer left between adjacent clearances is increased to suppress increase in electrical resistance at that portion.

3 Claims, 6 Drawing Figures

MULTILAYER PRINTED CIRCUIT BOARD

BACKGROUND OF THE INVENTION

1. Field of the Invention

The present invention relates to a multilayer printed circuit board, and in particular to an improved shape of a clearance formed on a through-hole area of a power supply layer of a multilayer printed circuit board.

2. Description of the Prior Art

The power supply layer of the multilayer printed circuit board has a clearance (a portion cleared of conductors) in the through-hole portion for the purpose of avoiding shortcircuit between a power layer conductor and a through-hole conductor. Conventional multilayer printed circuit boards have round-shaped clearances or quadrangle clearances with four right-angled corners. For example, round-shaped clearances are disclosed in Japanese Patent Unexamined Publication No. 121168/74.

As LSI's become higher in speed and density, multilayer printed circuit boards for mounting the LSI's also become larger in density and area. When a number of electric components including LSI's are mounted with high density on multilayer printed circuit boards having higher component densities and larger areas, the current supplied to the electric components becomes extremely large. Accordingly, the resistance of the power supply layer must be made sufficiently small to suppress the voltage drop across the power supply layer. For this purpose, it is effective to decrease the area of the clearance formed in the power supply layer.

Meanwhile, more strict conditions of dimension deviation such as deviation in lamination or deviation in hole forming position are imposed on a multilayer printed circuit board having a higher component density and a larger area. The size of the clearance of the power supply layer must be determined by taking the above described fact into full consideration. If the size of the clearance is too small, shortcircuit failures between the through-hole and the power supply layer conductor due to dimension deviation caused during the manufacturing process are increased, resulting in a lowered productivity of the multilayer printed circuit board.

SUMMARY OF THE INVENTION

An object of the present invention is to provide a multilayer printed circuit board in which the increase in resistance of the power supply layer caused by clearance formation is decreased without causing a shortcircuit failure between the through-hole conductor and the power supply layer conductor.

Another object of the present invention is to provide a multilayer printed circuit board suitable to high density mounting of circuit components.

In accordance with the present invention, in a multilayer printed circuit board including a plurality of conductor layers laminated via insulator layers, a plurality of through-holes used for selective connection between conductor layers, and clearances disposed for insulation at respective through-hole formation positions of conductor layers which function as power supply layers, each clearance is made to be nearly a quadrangle having four circular corners.

Even if a large number of clearances are arranged on the power-supply layer in a two dimensional manner, a wide conductor layer can be left between adjacent clearances owing to the above described special shape of the clearance in accordance with the present invention. Thus, the electric resistance of the conductor between adjacent clearances can be reduced as compared with the prior art.

Other objects and advantages of the invention will become apparent during the following description of the accompanying drawings.

DESCRIPTION OF THE PREFERRED EMBODIMENT

Figure 1:
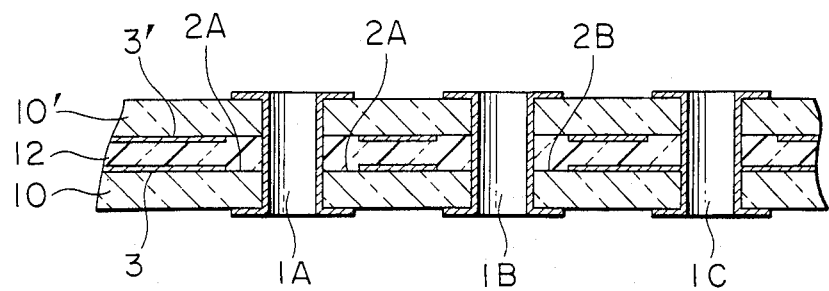
FIG. 1 is a drawing for schematically illustrating a sectional structure of a multilayer printed circuit board.

FIG. 1 is a sectional view for schematically illustrating a multilayer printed circuit board whereto the present invention is applied. A multilayer printed circuit board according to the present invention is similar to a conventional known multilayer printed circuit board when compared with respect to the sectional structure. For convenience, therefore, FIG. 1 exemplifies a simplified structure comprising an insulator substrate 10 having a conductor layer 3 which is a power supply layer, another insulator substrate 10' having a conductor layer 3' which is a printed signal line or another power supply layer, and a thermosetting binding sheet 12 for laminating the insulator substrates 10 and 10' across it.

Figure 2:
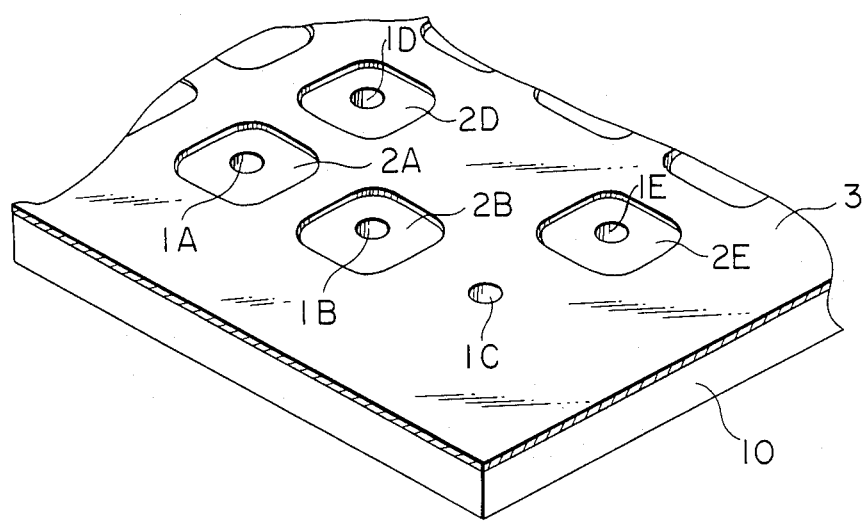
FIG. 2 is an oblique view for illustrating clearances formed on a power supply layer.

In FIG. 1, through-holes 1A, 1B and 1C are formed by opening holes entirely through the laminated printed circuit board by means of a drill or the like and by forming conductive films inside the holes by means of nonelectrolytic plating and/or electrolytic plating. These conductive films are selectively connected to the power supply layer or signal lines inside the printed circuit board. And ends of these conductive films are suitably connected to wiring layers located on the surface of the circuit board. As shown in FIG. 2 which is a partial enlarged view of the power supply layer 3, clearances 2 (2A–2E) are formed by partially removing the power supply layer around through-holes 1A–1E excepting the through-hole 1C to be connected to the power supply layer.

The multilayer printed circuit board according to the present invention is characterized by the shape of clearance 2 provided on the power supply layer 3 or 3'. Each clearance is a quadrangle as a whole. And each of its four corners has a circular arc form with the radius of R.

Figure 3:
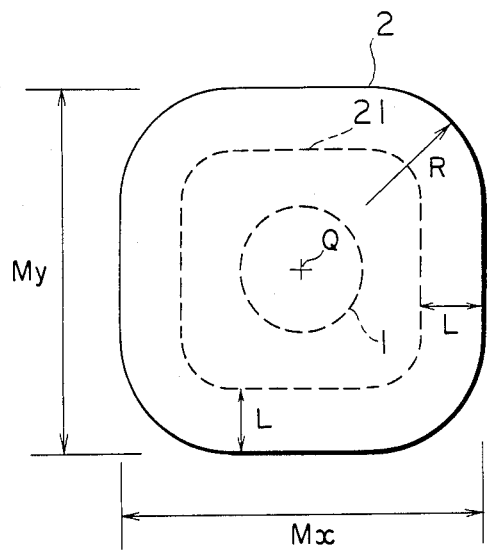
FIG. 3 is a drawing for illustrating a plane shape of a clearance adopted in accordance with the present invention.

FIG. 3 is an enlarged view of the clearance 2. A point Q is a virtual grid point representing the standard position of the center point of a through-hole 1. Reference numeral 21 represents the maximum allowable deviation range for the edge of an actual through-hole which deviates from the virtual grid point. Mx and My represent dimensions of the clearance 2 in X direction and Y direction, respectively. R is a radius of curvature for each of four corners of the clearance. L represents the minimum guaranteed spacing between the throughhole and the power supply layer.

In the manufacturing process of individual substrates 10 and 10' of the multilayer printed circuit board, we must allow for some degree of position deviation of each clearance provided on the power supply layer from the virtual grid point Q. Also when through-holes are formed on laminated substrates, we must allow for position deviation between the through-hole and the virtual grid point. Position deviations or dimension deviations caused during these processing steps are hereafter collectively referred to as "registration".

Figure 4:
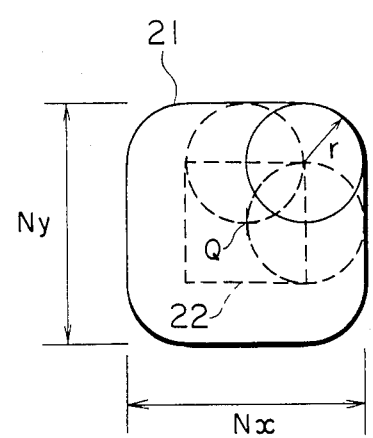
FIG. 4 is a drawing for illustrating an existence range of a through-hole edge when a registration exists in the maximum allowable range.

If the allowable range of the registration for the center point of the through-hole 1 with respect to the virtual grid point is set as represented by a box 22 surround by broken lines of FIG. 4, the maximum allowable deviation range 21 of the position of the through-hole edge has dimensions Nx and Ny respectively in the X direction and Y direction, which are represented as Nx = [maximum registration value in the X direction] + drill diameter Ny = [maximum registration value in the Y direction] + drill diameter.

Therefore, the dimensions of the clearance 2 of FIG. 3 are represented as $$Mx = Nx + 2L$$

$$My = Ny + 2L$$

$$R = r + L$$

where r = drill diameter/2.

Figure 5:
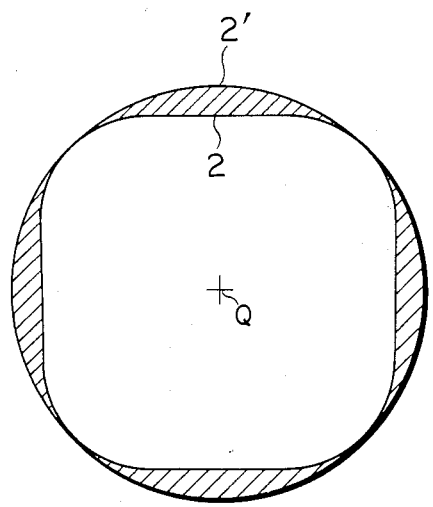
FIG. 5 shows a clearance according to the present invention in contrast with a conventional round-shaped clearance.
Figure 6:
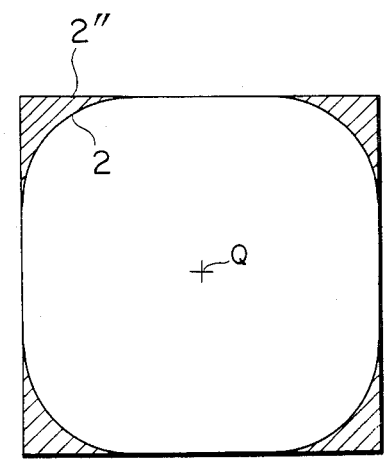
FIG. 6 shows a clearance according to the present invention in contrast with a conventional square shaped clearance.

FIGS. 5 and 6 illustrate the clearance 2 according to the present invention in contrast with a conventional round shaped clearance 2' and with a conventional square shaped clearance 2", respectively.

Assuming that the size of the registration and the minimum spacing between the through-hole and the power supply layer are identical, the clearance 2 is so sized as to touch internally the conventional round shaped clearance 2' at four circular arc portions as evident from FIG. 5. Therefore, the clearance of the present invention can be reduced in size by a shaded area as compared with that of the prior art. As shown in FIG. 6, the clearance 2 of the present invention is so sized as to internally touch the conventional square shaped clearance 2" as well. Therefore, the clearance of the present invention can be reduced in size by shaded corner areas.

Thus, the area occupied by each clearance can be reduced. When a large number of clearances 2A, 2B, 2D, 2E and so on are formed for through-holes on the power supply layer 3 in a two dimensional way as shown in FIG. 2, therefore, it is possible to leave a wider conductor layer between adjacent clearances in the multilayer wiring board according to the present invention as compared with the prior art. Accordingly, it is possible to suppress the increase in electric resistance at these positions. Since in this case the allowable value of the registration is the same as that of the prior art, productivity is not lowered by the change in the manufacturing condition.

In the above described embodiment, the clearance is nearly square shaped. When the registration in X direction is different from that in Y direction, or for some through-hole arrangements, however, the clearance may be a rectangle having circular arcs at its four corners.

We claim:

1. A multilayer printed circuit board including a plurality of conductor layers laminated via insulator layers, a plurality of through-holes used for selective connection between the conductor layers, and clearances disposed for insulation at respective through-hole formation positions of conductor layers which function as power supply layers, wherein each of said clearance is nearly a quadrangle having four circular corners.

2. A multilayer printed circuit board according to claim 1, wherein each of said clearances is nearly a square having four circular corners.

3. A multilayer printed circuit board according to claim 1, wherein each of said four circular corners of said clearances has a radius of curvature which is larger than the radius of said through-hole.

* * * * *